(12) United States Patent
Jinbo et al.

(10) Patent No.: US 6,473,226 B1
(45) Date of Patent: Oct. 29, 2002

(54) SILICA GLASS MEMBER

(75) Inventors: Hiroki Jinbo, Tokyo (JP); Seishi Fujiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/597,093

(22) Filed: Jun. 20, 2000

(30) Foreign Application Priority Data

Jun. 21, 1999 (JP) ............................................. 11-174239

(51) Int. Cl.⁷ ................................................ G02B 13/14
(52) U.S. Cl. ......................... 359/355; 359/737; 65/414
(58) Field of Search ................................ 359/355, 737; 65/414, 415, 416, 421, 17.4; 501/54

(56) References Cited

U.S. PATENT DOCUMENTS 5,523,266 A  * 6/1996 Nishimura et al. ........... 501/54
5,696,038 A  * 12/1997 Maxon ........................ 501/54

FOREIGN PATENT DOCUMENTS

| EP | 0 735 006 A1 | 10/1996 |
| EP | 0 861 812 A1 | 9/1998 |
| EP | 0 878 451 A1 | 11/1998 |
| JP | 8-262201 | 10/1996 |
| JP | 10-087334 | 4/1998 |
| JP | 10-160627 | 6/1998 |
| WO | WO 97/10182 | 3/1997 |
| WO | WO 97/10184 | 3/1997 |

* cited by examiner

Primary Examiner—Cassandra Spyrou
Assistant Examiner—Fayez Assaf
(74) Attorney, Agent, or Firm—Morgan, Lewis & Bockius LLP

(57) ABSTRACT

A silica glass member is provided for use in an optical system using light of a wavelength equal to or less than about 400 nm as a light source. The silica glass member has striae in a direction different from an optical axis of the optical system. The strength of the striae is equal to or less than about $2\times10^{-6}$ in terms of refractive index differential.

14 Claims, 2 Drawing Sheets

SILICA GLASS MEMBER

This application claims the benefit of Japanese Application No. 11-174239, filed in Japan on Jun. 21, 1999, which is hereby incorporated by reference.

BACKGROUND OF THE INVENTION

1. Field of the Invention

The present invention relates to a silica glass member, and more particularly, to a photolithography-use silica glass member used in an optical system, such as a lens or mirror, in photolithography in the wavelength band of less than about 400 nm, preferably less than about 300 nm.

2. Discussion of the Related Art

In recent years, higher integration and multi-functionality of VLSI (Very Large Scale Integration) have been significantly advanced. For example, in the field of logic VLSI, system-on-chip technology, in which a large system is incorporated in a chip, has been developed. Such a technological advance increasingly requires finer pattern formation and higher integration techniques on a wafer, such as a silicon wafer, which is a substrate for such chips. An exposure apparatus called "stepper" has been used in photolithography technique, which exposes and transfers a fine pattern of an integrated circuit onto a wafer (e.g., silicon wafer).

For example, for a DRAM, which is an example of VLSI, as the technology advances from LSI to VLSI, its capacity increases as 1M→4M→16M→64M→256M→1G. Such an increase in capacity requires a photolithography apparatus that is capable of fine pattern fabrication as 1 $\mu$m→0.8 $\mu$m→0.5 $\mu$m→0.35 $\mu$m→0.25 $\mu$m→0.18 $\mu$m, respectively, in terms of the fabrication line width.

Accordingly, projection lenses in the stepper are required to have a high resolving power and a deep focal depth. The resolving power and focal depth are determined by the wavelength of light used in exposure and N.A. (Numerical Aperture) of the lens.

The finer the pattern, the larger the angle of diffraction light. Thus, for a finer pattern, diffraction light cannot be properly included unless the lens has a sufficiently large N.A. On the other hand, the shorter the exposure wavelength $\lambda$, the smaller the angle of diffraction light for the same pattern. Thus, the N.A. of a relatively smaller value may be sufficient.

The resolving power and the focal depth are expressed by the following formulae:

Resolving Power=$K1 \cdot \lambda / N.A.$

Focal Depth=$K2 \cdot \lambda / N.A.^2$ where K1 and K2 are proportional constants.

Thus, to improve the resolving power, either N.A. can be increased, or $\lambda$ can be shortened. As seen from the above formulae, shortening of $\lambda$ is advantageous in terms of the focal depth. In light of this consideration, the wavelength of the light source has been shortened from the g-line (436 nm) to the i-line (365 nm), and further to KrF excimer laser (248 nm) and to ArF excimer laser (193 nm).

Silica glass, particularly synthetic silica glass manufactured by an oxygen/hydrogen flame hydrolysis method using $SiCl_4$ as the material, has an extremely low metal impurities and a high transmittance with respect to ultraviolet light.

It has been required that silica glass used in an optical system for precision apparatus, such as projection lenses for photolithography, not have any striae in any direction. Accordingly, processes for removing striae have been necessary or special techniques have been introduced during the synthesis. Moreover, a cumbersome step of selecting desired products among silica glass produced has been required, which has caused a poor yield. Because of these extra steps, such silica glass has been very expensive as compared with silica glass of the normal optical grade, and particularly with a recent trend towards a larger diameter of projection lenses, the high cost associated with manufacture of projection lenses has posed a serious drawback in the industry.

The striae are displayed on a screen when silica glass is observed by a projection device using a pin-hole method, as shown in FIG. 1. In particular, a silica glass manufactured by the oxygen/hydrogen flame hydrolysis method tends to include striae in the form of stripes. This is due to the manufacture method, which involves depositing of $SiO_2$ powder on a target or vessel, fusing, and vitrifying.

The method for measuring striae illustrated in FIG. 1 is similar to the striae measurement method specified in JOGIS 11-1975 in *Japanese Optical Glass Industrial Standards, Appendix: Explanations on Measuring Method of Optical Glass*, translated and published by Japan Optical Glass Manufacturers Association, which is hereby incorporated by reference. The striae measurement is conducted using the pin-hole method, the optical elements of which are arranged as shown in FIG. 1, and an interferometer technique, so-called "oil-on-plate method" Light emitted from a light source 1 passes through a slit 2 and a sample 3, and produces a striae image on a screen 4 in the form of stripes. The distance between the light source 1 and the pin-hole slit 2 is set to 4 m. As shown in FIG. 1, the strength of striae corresponds to the difference between the darkest part and the brightest part of the striae observed on the screen, and the spacing between striae is observed as the spacing between two adjacent peaks of the bright lines or dark lines. A standard sample having known striae is used to calibrate this striae measurement. Then, a striae pattern of a sample to be measured is observed in a manner shown in FIG. 1. As shown in FIG. 1, the strength of striae in terms of refractive index differential is derived from the width of the observed striae pattern, and an actual spacing between striae in the sample is derived from the observed spacing between the two adjacent peaks in the observed striae with reference to the calibration sample.

SUMMARY OF THE INVENTION

Accordingly, the present invention is directed to a silica glass member that substantially obviates the problems due to limitations and disadvantages of the related art.

An object of the present invention is to provide a silica glass member with a lower cost without sacrificing its focusing characteristics.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a silica glass member for use in an optical system using light of a wavelength equal to or less than about 400 nm as a light source, the silica glass member having striae in a direction different from an optical axis of the optical system, the strength of the striae being equal to or less than about $2\times10^{-6}$ in terms of refractive index differential.

In another aspect, the present invention provides an exposure apparatus having an illumination optical system for directing light from a light source towards a mask having a pattern thereon and a projection optical system for projecting an image of the pattern on the mask towards a substrate to expose the image on the substrate, wherein the silica glass member of the present invention is installed in at least one of the illumination optical system and the projection optical system.

In a further aspect, the present invention provides an optical system having an optical axis, including a silica glass member for processing light of a predetermined wavelength along the optical axis, the silica glass member having striae extending in a direction substantially perpendicular to the predetermined optical axis of the optical system, the strength of the striae being smaller than about $2\times10^{-6}\times$(the value of the predetermined wavelength of the light in nanometers)/ 632.8 (nm) in terms of refractive index differential.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
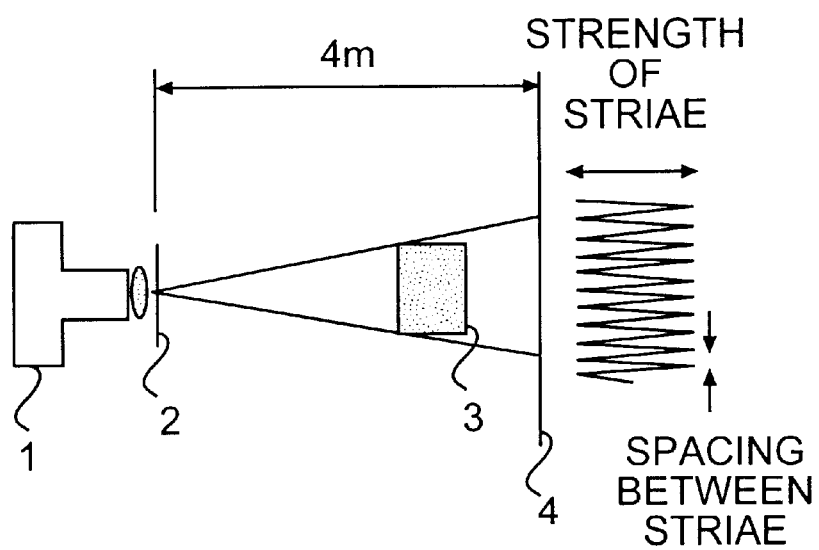
FIG. 1 shows a striae observation method.

Reference will now be made in detail to the preferred embodiments of the present invention, examples of which are illustrated in the accompanying drawings.

The present inventors conducted diligent research regarding characteristics of striae in silica glasses manufactured under various conditions and the effects on the focus characteristics of the striae characteristics. As a result, the following discoveries were made.

If the strength of striae with respect to the wavelength of KrF excimer laser (248 nm) is equal to or less than about $0.8\times10^{-6}$ in terms of refractive index differential, its effects on the wavefront aberration for the projection lens is small so that the deterioration of the wavefront aberration can be suppressed within a permissible range.

The effects on the wavefront aberration of the strength of striae increase in proportion to the wavelength ratio. Thus, the permissible strength of striae changes depending upon the wavelength of the light source—the shorter the wavelength, the larger the effects of striae.

Furthermore, the shorter the spacing between striae, the smaller the effects on the wavefront aberration for the lower order components. If this spacing is equal to or less than 2 mm, the deterioration in the wavefront aberration can be suppressed within a permissible range for general-purpose ultraviolet optical systems.

Owing to these discoveries, the present invention provides, in a first aspect, a silica glass member for use in an optical system using light having a wavelength equal to or less than about 400 nm as a light source, including striae in directions other than a predetermined direction, the strength of the striae being equal to or less than about $2\times10^{-6}$ in terms of refractive index differential.

By taking into account the discovery that the effects on wavefront aberration of the strength of the striae increase with the wavelength ratio, it is preferable that the strength of the striae be equal to or less than about $2\times10^{-6}\times$ "wavelength"/632.8 (nm) in terms of refractive index differential for a given "wavelength" used.

In the silica glass member according to the first aspect of the present invention described above, a spacing between striae may be set to be equal to or less than about 2 mm so that the effects on the wavefront aberration can be further reduced.

Further, in the present invention, the fluctuation in the OH group concentration preferably is set to be equal to or less than about 50 ppm. This is because it is known that if the OH group concentration increases by 1 ppm, the refractive index is reduced by about $10^{-7}$, and a large reduction in refractive index may cause striae.

As described above, according to the present invention, even for a silica glass having striae in directions other than a predetermined direction, the effects on wavefront aberration of the striae can be reduced. Thus, the present invention achieves a significant cost reduction in optical members, such as projection lenses, without sacrificing characteristics of the optical members.

First, a silica glass member according to the present invention has striae in directions other than a predetermined direction. The predetermined direction corresponds to, for example, the direction of the optical axis of an optical system when the silica glass member is installed in the optical system. In particular, it is considered that if stripe-shape striae are perpendicular to the optical axis of the optical system, the effects on wavefront aberration is minimized.

As described above, striae in the silica glass manufactured by the flame hydrolysis method are displayed on a screen in the form of stripes when they are observed using a pin-hole method. The contrast observed forms such a pattern because light from the light source is refracted in accordance with the refractive index fluctuation within the silica glass. The lighter and darker parts of this contrast correspond to the strength of the striae. They change in accordance with the striate refractive index differential. Such a striate refractive index differential can be quantitatively analyzed by the oil-on-plate method using an interferometer.

Secondly, the strength of the striae in the silica glass member of the present invention is restricted to be equal to or less than a predetermined value. The uniformity in refractive index in silica glass members that have been used in optical systems for a light source of light having a wavelength equal to or less than about 400 nm is on the order of $10^{-5}$ to $10^{-6}$ in all directions. However, striae occur where the refractive index changes abruptly. Accordingly, striae are considered to correspond to a refractive index differential that is larger that these values by one or more digit—i.e., on the order of $10^{-4}$ to $10^{-5}$.

According to the present invention, by restricting the strength of the striae to a value equal to or less than about $2\times10^{-6}$, the silica glass member having such striae can be used in an optical system for ultraviolet. By taking into account the discovered fact that the effects on wavefront aberration of the strength of the striae increase with the wavelength ratio, it is preferable to further restrict the strength of the striae to a value equal to or less than $0.8\times10^{-6}$ for the wavelength range of KrF excimer laser, and about $0.6\times10^{-6}$ for the wavelength range of ArF excimer laser.

In such a silica glass member having striae in directions other than a predetermined direction, the strength of the striae being equal to or less than about $2\times10^{-6}$, a spacing between the striae preferably is set to equal to or less than about 2 mm. In a projection optical system for photolithography, light incident on silica glass members is not necessarily perpendicular to the surface of the members. When the light is incident on the silica glass member in an oblique direction, the adverse effects of striae become larger. In the present invention, by reducing the spacing between the striae, it becomes possible to reduce the effects of the striae on the incident light even when the incident light is obliquely entered into the silica glass member.

A method for manufacturing a silica glass member of the present invention using a flame hydrolysis method (sometimes called "direct method") is explained next.

Figure 2:
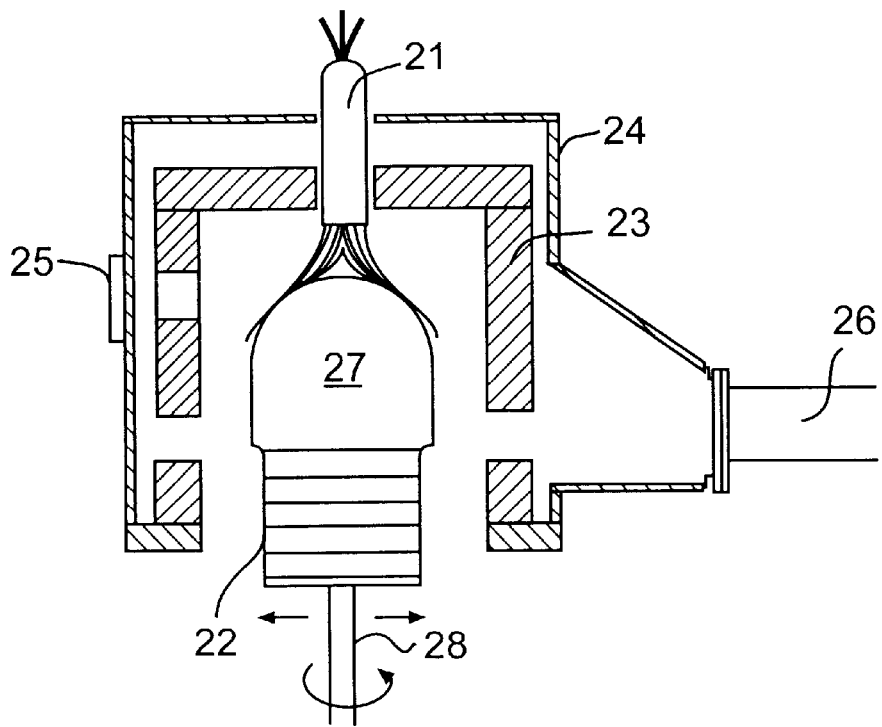
FIG. 2 is a schematic view of a synthesis furnace to be used for manufacturing a synthetic silica glass of the present invention.

FIG. 2 shows a synthesis furnace for synthesizing a synthetic silica glass of the present invention. A burner 21 is made of silica glass and has a multi-tube structure. The burner 21 is installed on the upper part of the furnace with its emission end facing towards a target 22. The walls of the furnace are formed of fire-proof members 23. A window for naked-eye observation, a window 25 for IR camera monitoring, and an exhaust system 26 are provided in the furnace. A target 22 is disposed at the bottom part of the furnace for forming an ingot 27 thereon. The target 22 is connected to an XY stage located at the exterior of the furnace through a support shaft 28. The support shaft 28 is rotatable via a motor. The XY stage is movable in the X and Y directions in a two-dimensional manner via an X-axis servo motor and a Y-axis servo motor, respectively. The X-axis servo motor and the Y-axis servo motor are controlled by a computer.

An oxygen containing gas and a hydrogen containing gas are expelled from the burner 21, and are mixed to form a flame. A silicon compound, as the material, is diluted with a carrier gas and expelled from the center portion of the burner 21 into the flame thus formed. This creates fine silica glass particles (soot) through hydrolysis reaction of the material. The fine silica glass particles are deposited on the target 22, which is rotated and rocked, and the particles are simultaneously fused and vitrified to form a transparent silica glass ingot 27. During the synthesis, the upper part of the ingot 27 is covered by the flame, and the target 22 is pulled down in such a way as to maintain a constant distance from the burner 21 to synthesis surface at the upper part of the ingot.

As the material to be expelled from the center part of the burner 21, silicon tetrachloride is often used. Other examples for the material that can be used include, but are not limited to, organic silicon compound, such as siloxanes (such as hexamethyldisiloxane, octamethylcyclotetrasiloxane, and tetramethylcyclotetrasiloxane, etc.) and silanes (such as methyltrimethoxysilane, tetraethoxysilane, and tetramethoxysilane); fluorinated silicon, such as $SiF_4$ and $Si_2F_6$; and other materials, such as $SiH_4$ and $Si_2H_6$.

When a silica glass is synthesized using an organic silicon compound as the material, metal impurities tend to be incorporated in the resultant silica glass. Thus, impurity contamination from the synthesis atmosphere needs to be carefully taken care of. The silica glass thus manufactured has a chlorine concentration equal to or less than 1 ppm, and has an excellent durability against ultraviolet irradiation.

When silicon fluoride is used as the material in synthesizing a silica glass, the silicon fluoride is expelled from the center portion of the burner 21 or from a ring-shape nozzle adjacent to the center portion. The content of fluorine in the resultant silica glass preferably is between about 0.01 wt. % and about 0.5 wt. %. If the fluorine content is greater than about 0.5 wt. %, fluorine exists in the silica glass in the form of fluorine molecules as well as in the form of Si—F. As a result, the initial transmittance deteriorates due to absorption by fluorine molecules in the ultraviolet region. The silica glass manufactured using silicon fluoride has a chlorine concentration equal to or less than 1 ppm, a high initial transmittance, and a superior durability against ultraviolet. In particular, as for the durability against ultraviolet, the fluorine containing silica glass has a high transmittance even after the transmittance decreases due to ultraviolet irradiation to its saturated value. This is because the fluorine containing silica glass has less amounts of defect precursors and similar structures, as compared with the silica glass that does not contain fluorine.

A silica glass obtained by the direct method normally includes the OH group in the amount of 800 to 1200 ppm. Such a silica glass including a large amount of the OH group is suitable as optical members for ultraviolet because the transmittance deterioration and refractive index changes are unlikely to occur. However, striae tend to be generated in a plane perpendicular to the growth direction during the synthesis.

Thus, in manufacturing the silica glass member of the present invention, it is necessary to provide proper synthesis conditions in order to avoid creation of too strong striae.

Because a change in temperature within the furnace and at the synthesis surface would generate undesirably strong striae, it is preferable to control the exhaust amount, measure the temperature inside the furnace, and perform feedback control of the synthesis conditions (gas flow rates from the burner and the area of the opening at the bottom part of the furnace, etc.).

Also, a higher temperature at the synthesis surface of the ingot is preferable because it alleviates striae through fusing even if striae are generated. To increase the temperature at the synthesis surface of the ingot, it is effective to use a supplemental burner and/or to use an organic silicon compound as the material. Further, in order to increase the size of the flame to reduce the effects of the temperature changes within the furnace, it is preferable to use a burner having a large emitting surfaces for the material gas and the combustion gases. Such a multi-nozzle burner may be constructed of a circular-shape pipe for emitting the material at the center part, a plurality of ring-shape pipes disposed concentrically with the circular-shape pipe, and a ring-shape pipe at the periphery having a plurality of small pipes in its interior. Further, it is also effective to use a plurality of burners in forming a single ingot.

If the hydrogen to oxygen ratio $H_2/O_2$ is close to the stoichiometric ratio, a high temperature flame tends to be created. Accordingly, the ratio of the oxygen containing gas to the hydrogen containing gas, which are expelled from the burner, is set to be close to the stoichiometric ratio. Taking into account introduction of the air from the opening at the bottom part of the furnace, it is preferable to set the value of $H_2/O_2$ to between about 0.35 and about 0.45 in the case of using halogenated silicon, such as silicon tetrachloride, as the material. In the case of using an organic silicon compound as the material, because oxygen is consumed via its reaction with the material, the value of $H_2/O_2$ preferably is between about 0.45 and about 0.55.

If after the ingot is synthesized in this or a similar manner, the amount of striae is found to be greater than a permissible value, it is possible to alleviate the strength of the striae through a thermal treatment. In such a thermal treatment, the silica glass is heated to a temperature higher than about 1600° C., maintained at that temperature, and gradually cooled down as in the case of the normal striae removal process. However, because various measures are taken to reduce striae, as described above, the annealing time (holding time) may be shortened.

In order to reduce a spacing between striae to a value equal to or less than 2 mm in the manufacture of silica glass by the direct method, a deposition rate of the ingot during the synthesis is set to be slow; 2 mm/hour, for example.

Further, by enlarging the rocking pattern of the target on which silica glass ingot is formed, the resultant ingot can have a larger diameter. This also effectively reduces the deposition rate, and therefore, contributes to reduction of the spacing between striae.

Also, after manufacturing a rod-shape synthetic silica glass ingot having a diameter of φ250 mm using a usual direct method, the ingot may be heated to a temperature that is higher than the softening point, and may undergo press-formation in such a way as to expand the diameter of the rod. This way, the striae that had its strength greater than $2 \times 10^{-6}$ in terms of refractive index differential before the press-formation can be expanded to have the strength less than $2 \times 10^{-6}$. Further, by the press-formation, the spacing between striae can be narrowed.

The distribution of the OH group preferably is within 50 ppm particularly in the direction of the ingot growth. In order to achieve such a uniform distribution of the OH group concentration in the direction of the ingot growth, the relative distance from the burner to the ingot is controlled. That is, the ingot is pulled down in a manner such that the top of the ingot (synthesis surface) and the position of the burner are separated by a constant distance during the synthesis.

Figure 3:
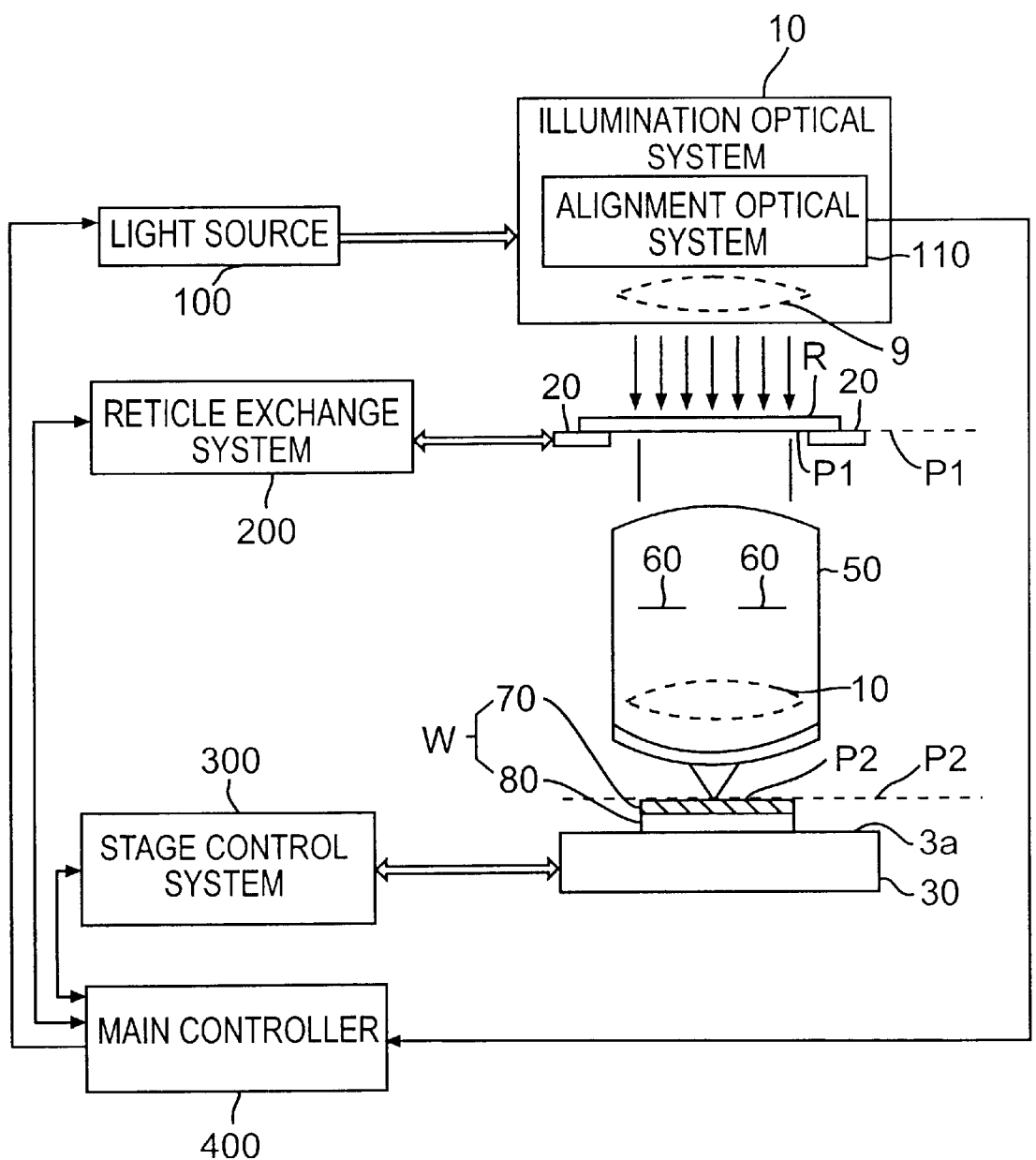
FIG. 3 is a schematic view of a projection exposure apparatus, which uses silica glass members of the present invention.

A silica glass member of the present invention is used as a member constituting an optical system, such as a lens, of a projection exposure apparatus using ultraviolet of a short wavelength of preferably less than 250 nm as a light source. FIG. 3 schematically shows a main construction of such a projection exposure apparatus.

This apparatus includes a stage 30, which is capable of holding, on its surface 3a, a wafer W (substrate) having a photosensitive material coated thereon, an illumination optical system for uniformly illuminating a reticle R (mask) having a pattern thereon with exposure light, a light source 100 for providing exposure light to the illumination optical system, and a projection optical system 50 disposed between a first surface P1 (object surface), on which the reticle R is placed in order to project the pattern on the reticle R onto the wafer W, and a second surface P2 (image surface) which coincides with the surface of the wafer W. The illumination optical system includes an alignment optical system 110 for adjusting relative positions between the reticle R and the wafer W. The reticle R is held on a reticle stage 20, which is movable in parallel with the surface 3a of the wafer stage 30. A reticle exchange system 200 exchanges and conveys the reticle R set on the reticle stage 20. The reticle exchange system 200 also includes a stage driver for moving the reticle stage 20 in a direction parallel to the surface 3a of the wafer stage 30.

A projection exposure apparatus according to the present invention may be a scanning type exposure apparatus, which synchronously moves a reticle (mask) and a wafer (substrate) in exposing a reticle pattern onto the wafer, or a step-and-repeat type exposure apparatus, which exposes a mask pattern while the reticle and the wafer are at rest, and which translates the substrate stepwise.

The projection exposure apparatus of the present invention utilizes a light source of ultraviolet or vacuum ultraviolet. Examples of such a light source include KrF excimer laser (248 nm), ArF laser (193 nm), and $F_2$ laser (157 nm).

Next, working examples of the present invention will be described.

FIRST WORKING EXAMPLE

Using $SiCl_4$ (silicon tetrachloride) as the material, a synthetic silica glass ingot was manufactured in the synthesis furnace shown in FIG. 2 by the oxygen/hydrogen flame hydrolysis method. The material, oxygen gas, and hydrogen gas were expelled from the burner with the oxygen/hydrogen ratio of 0.44 to form an ingot having dimensions of φ300×t800 mm. The ingot growth rate was set to 2.4 mm/hr. The OH group concentration distribution in the direction of the silica glass ingot growth was measured and found to be equal to or less than 50 ppm at a part from which optical members are being cut out.

Members were cut out from the ingot, and striae of the silica glass were observed in a direction different from an optical axis of an optical system for which the members are to be used. The thus measured strength of the striae was confirmed to be equal to or less than $0.8 \times 10^{-6}$ in terms of refractive index differential, and the spacing between striae was confirmed to be equal to or less than 2.0 mm. Further, the fluctuation in refractive index in the direction of thickness (a direction perpendicular to the optical axis when the optical member is used) was measured and found to be $2.5 \times 10^{-6}$, and the fluctuation in birefringence amount was found to be about 2.2 nm/cm. The amount of birefringence was measured in accordance with JOGIS 14-1975 described in *Japanese Optical Glass Industrial Standards, Appendix: Explanations on Measuring Method of Optical Glass*, translated and published by Japan Optical Glass Manufacturers Association, which is hereby incorporated by reference, using an apparatus manufactured by ORC Manufacturing Co., Ltd. (The same method was employed in measuring the fluctuation in birefringence amount in other working examples below.)

The thus produced silica glass members can achieve desired characteristics (contrast, resolving power, etc.) when used as optical members for excimer laser.

SECOND WORKING EXAMPLE

Using HMDS (hexamethyldisiloxane) as the material, a synthetic silica glass ingot was manufactured in the synthesis furnace shown in FIG. 2 by the oxygen/hydrogen flame hydrolysis method. The material, oxygen gas, and hydrogen gas were expelled from the burner with the oxygen/hydrogen ratio of 0.53 to form an ingot having dimensions of φ300×t800 mm. The ingot growth rate was set to 2.4 mm/hr. The OH group concentration distribution in the direction of the silica glass ingot growth was measured and found to be equal to or less than 50 ppm at a part from which optical members are being cut out.

Members were cut out from the ingot, and striae of the silica glass were observed in a direction different from an optical axis of an optical system for which the members are to be used. The thus measured strength of the striae was confirmed to be equal to or less than $0.6 \times 10^{-6}$ in terms of refractive index differential, and the spacing between striae was confirmed to be equal to or less than 2.0 mm. Further, the fluctuation in refractive index in the direction of thickness (a direction perpendicular to the optical axis when the optical member is used) was measured and found to be $1.8 \times 10^{-6}$, and the fluctuation in birefringence amount was found to be about 1.2 nm/cm.

The thus produced silica glass members can achieve desired characteristics (contrast, resolving power, etc.) when used as optical members for excimer laser.

Further experiments were conducted, and it was confirmed that even if other organic silicon compounds, such as OMCTS (octamethylcyclotetrasiloxane), MTMS (methyltrimethoxysilane), were used as the material instead of the HMDS in this second working example, similar results were obtained. The thus produced silica glass members can achieve desired characteristics (contrast, resolving power, etc.) when used as optical members for excimer laser.

THIRD WORKING EXAMPLE

Using $SiCl_4$ (silicon tetrachloride) as the material, a synthetic silica glass ingot was manufactured in a synthesis furnace having a plurality of burners, which was modified from the furnace shown in FIG. 2, by the oxygen/hydrogen flame hydrolysis method. Such use of the plurality of burners is effective in obtaining a large diameter ingot and in reducing the spacing between striae. The material, oxygen gas, and hydrogen gas were expelled from the burner with the oxygen/hydrogen ratio of 0.44 to 0.55 to form an ingot having dimensions of $\phi 1000 \times t400$ mm. The ingot growth rate was set to 1.2 mm/hr. The OH group concentration distribution in the direction of the silica glass ingot growth was measured and found to be 38 ppm at a part from which optical members are being cut out.

Members were cut out from the ingot, and striae of the silica glass were observed in a direction different from an optical axis of an optical system for which the members are to be used. The thus measured strength of the striae was confirmed to be equal to or less than $0.3 \times 10^{-6}$ in terms of refractive index differential, and the spacing between striae was confirmed to be equal to or less than 1.2 mm. Further, the fluctuation in refractive index in the direction of thickness (a direction perpendicular to the optical axis when the optical member is used) was measured and found to be $1.2 \times 10^{-6}$, and the fluctuation in birefringence amount was found to be about 0.9 nm/cm.

The thus produced silica glass members can achieve desired characteristics (contrast, resolving power, etc.) when used as optical members for excimer laser.

FOURTH WORKING EXAMPLE

Using $SiCl_4$ (silicon tetrachloride) as the material, a synthetic silica glass ingot was manufactured in the synthesis furnace shown in FIG. 2 by the oxygen/hydrogen flame hydrolysis method. The material, oxygen gas, and hydrogen gas were expelled from the burner with the oxygen/ hydrogen ratio of 0.53 with rocking motion of the target to form an ingot having dimensions of $\phi 250 \times t1000$ mm. The ingot growth rate was set to 3.6 mm/hr. The OH group concentration distribution in the direction of the silica glass ingot growth was measured and found to be equal to or less than 50 ppm at a part from which optical members are being cut out.

Members were cut out from the ingot, and striae of the silica glass were observed in a direction different from an optical axis of an optical system for which the members are to be used. The thus measured strength of the striae was found to be about $2.5 \times 10^{-6}$ in terms of refractive index differential, and the spacing between striae was found to be about 2.5 mm. Further, the fluctuation in refractive index in the direction of thickness (a direction perpendicular to the optical axis when the optical member is used) was measured and found to be $4.5 \times 10^{-6}$, and the fluctuation in birefringence amount was found to be about 4.1 nm/cm.

Further, the fluctuation in refractive index in the direction of thickness (a direction perpendicular to the optical axis when the optical member is used) was measured and found to be 4.5 ppm, and the fluctuation in birefringence amount was found to be about 4.1 nm/cm.

The silica glass member was heated to a predetermined temperature between 1600° C. and 1900° C. (softening temperature), and a pressure was applied in the direction of the ingot growth to form a rod-shape having dimensions of about $400 \times t390$ mm. The striae were measured for the thus processed silica glass member. The measured strength of the striae was found to be about $0.9 \times 10^{-6}$ in terms of refractive index differential, and the spacing between striae was found to be about 1.1 mm. Further, the fluctuation in refractive index in the direction of thickness (a direction perpendicular to the optical axis when the optical member is used) was measured and found to be $2.6 \times 10^{-6}$, and the fluctuation in birefringence amount was found to be about 3.0 nm/cm.

The thus produced silica glass members that underwent the thermal process can achieve desired characteristics (contrast, resolving power, etc.) when used as optical members for excimer laser.

As described above, the present invention achieves significant reduction in the effects on wavefront aberration of striae that exist in the silica glass in a direction different from a predetermined direction. Accordingly, it becomes possible to provide optical members, such as projection optical lenses, with a reduced cost without sacrificing the characteristics of the optical members.

It will be apparent to those skilled in the art that various modifications and variations can be made in the silica glass member of the present invention without departing from the spirit or scope of the invention. Thus, it is intended that the present invention cover the modifications and variations of this invention provided they come within the scope of the appended claims and their equivalents.

What is claimed is:

1. A silica glass member for use in an optical system using light of a wavelength equal to or less than about 400 nm as a light source, the silica glass member having striae in a direction different from an optical axis of the optical system, the strength of the striae being equal to or less than about $2 \times 10^{-6}$ in terms of refractive index differential, wherein a spacing between striae is equal to or less than 1.2 mm and having a value greater than zero.

2. The silica glass member according to claim 1, wherein a fluctuation in concentration of the OH groups in the silica glass member is equal to or less than about 50 ppm.

3. A silica glass member for use in an optical system using light of a wavelength equal to or less than about 400 nm as a light source, the silica glass member having striae in a direction different from a predetermined direction, the strength of the striae being equal to or less than about $2\times10^{-6}\times$(the value of the wavelength in nanometers)/632.8 (nm) in terms of refractive index differential, a spacing between striae is equal to or less than 1.2 mm and having a value greater than zero.

4. The silica glass member according to claim 3, wherein a fluctuation in concentration of the OH groups in the silica glass member is equal to or less than about 50 ppm.

5. The silica glass member according to any one of claims 1, 2, 3, and 4, wherein a fluctuation in refractive index in a direction perpendicular to an optical axis of the silica glass member is equal to or less than about $4\times10^{-6}$.

6. The silica glass member according to any one of claims 1, 2, 3, and 4, wherein a fluctuation in birefringence amount in a direction perpendicular to an optical axis of the silica glass member is equal to or less than about 4 nm/cm.

7. An exposure apparatus having an illumination optical system for directing light from a light source towards a mask having a pattern thereon and a projection optical system for projecting an image of the pattern on the mask towards a substrate to expose the image on the substrate, wherein the silica glass member of any one of claims 1, 2, 3, and 4 is installed in at least one of the illumination optical system and the projection optical system.

8. An exposure apparatus having an illumination optical system for directing light from a light source towards a mask having a pattern thereon and a projection optical system for projecting an image of the pattern on the mask towards a substrate to expose the image on the substrate, wherein the silica glass member of any one of claims 1, 2, 3, and 4 is installed in at least one of the illumination optical system and the projection optical system, and wherein a fluctuation in refractive index in a direction perpendicular to an optical axis of the silica glass member is equal to or less than about $4\times10^{-6}$.

9. An exposure apparatus having an illumination optical system for directing light from a light source towards a mask having a pattern thereon and a projection optical system for projecting an image of the pattern on the mask towards a substrate to expose the image on the substrate, wherein the silica glass member of any one of claims 1, 2, 3, and 4 is installed in at least one of the illumination optical system and the projection optical system, and wherein a fluctuation in birefringence amount in a direction perpendicular to an optical axis of the silica glass member is equal to or less than about 4 nm/cm.

10. An optical system having an optical axis, comprising a silica glass member for processing light of a predetermined wavelength along the optical axis, the silica glass member having striae extending in a direction substantially perpendicular to the optical axis of the optical system, a strength of the striae in terms of refractive index differential being smaller than about $2\times10^{-6}\times$(a value of the predetermined wavelength in nanometers)632.8 (nm), a spacing between the striae in the silica glass member is equal to or less than 1.2 mm and having a value greater than zero.

11. The optical system according to claim 10, wherein the strength of the striae in the silica glass member in terms of refractive index differential is smaller than about $2\times10^{-6}$.

12. The optical system according to claim 10, wherein the strength of the striae in the silica glass member in terms of refractive index differential is smaller than about $0.8\times10^{-6}$.

13. The optical system according to claim 10, wherein the strength of the striae in the silica glass member in terms of refractive index differential is smaller than about $0.6\times10^{-6}$.

14. The optical system according to claim 10, wherein the strength of the striae in the silica glass member in terms of refractive index differential is within the range of about $0.6\times10^{-6}$ to about $2\times10^{-6}$.

* * * * *